(12) United States Patent
Miyashita et al.

(10) Patent No.: US 6,333,946 B1
(45) Date of Patent: Dec. 25, 2001

(54) SEMICONDUCTOR LASER DEVICE AND PROCESS FOR MANUFACTURING THE SAME

(75) Inventors: Motoharu Miyashita; Harumi Nishiguchi; Akihiro Shima; Yuji Ohkura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/370,911

(22) Filed: Aug. 10, 1999

(30) Foreign Application Priority Data

Feb. 19, 1999 (JP) .................................................. 11-041674

(51) Int. Cl.$^7$ ....................................................... H01S 5/22
(52) U.S. Cl. ................................................ 372/46; 372/45
(58) Field of Search ........................................ 372/45, 46

(56) References Cited

U.S. PATENT DOCUMENTS 5,694,410 * 12/1997 Motoda et al. ......................... 372/46

FOREIGN PATENT DOCUMENTS

| 2305486 | 12/1990 | (JP) . |
| 6196801 | 7/1994 | (JP) . |
| 10233556 | 9/1998 | (JP) . |

* cited by examiner

Primary Examiner—James W. Davie
(74) Attorney, Agent, or Firm—Leydig, Voit & Mayer, Ltd.

(57) ABSTRACT

A forward mesa ridge-embedded semiconductor laser device provides a high power output and includes a base portion of a forward mesa ridge having a narrow width to stabilize transverse mode oscillation and an upper cladding layer having a thickness sufficient to reduce loss of the laser beam, a top portion of the forward mesa ridge being interposed between parts of the current blocking layer to reduce the device resistance. The upper cladding layer includes a first cladding layer having the forward mesa ridge and a second cladding layer opposite the first cladding layer. The second cladding layer is deposited over the first cladding layer through the forward mesa ridge and a current blocking layer is positioned on both sides of the forward mesa ridge.

9 Claims, 10 Drawing Sheets

12: substrate, 14: lower clad layer, 16: active layer
18: first upper clad layer, 24: current block layer
26: second upper clad layer, 20: cap layer 12: substrate, 14: lower clad layer, 16: active layer
18: first upper clad layer, 24: current block layer
26: second upper clad layer, 20: cap layer

SEMICONDUCTOR LASER DEVICE AND PROCESS FOR MANUFACTURING THE SAME

BACKGROUND OF THE INVENTION

1. Field of the Invention

The present invention relates to a semiconductor laser device and a process for manufacturing the same. More particularly, it relates to a forward embedded mesa ridge semiconductor laser device provided with a forward mesa ridge on an upper cladding layer and a second upper cladding layer on the surface of the forward mesa ridge to reduce the resistance of the device and stabilize the transverse mode characteristic of a laser beam produced by the laser, and a process for manufacturing the laser.

2. Description of the Relate Art

As the storage capacities of information recording media used for personal computers and multimedia appliances increase, demands have been increasing for MO (magneto-optical disk) and CD-R (field progranmmable compact disk) that are information recording media wherein information can be written by the use of light. For laser devices used in writing information on such programmable optical disks, an infrared emitting laser beam having a wavelength of 780 nm and red laser beams having wavelengths in a range from 650 nm to 685 nm are used, which require increased output power while ensuring a stable transverse mode oscillation laser beam.

FIG. 8 is a perspective view of a forward mesa ridge-embedding type semiconductor laser of the prior art, and FIG. 9 is a cross sectional view taken along lines IX—IX in FIG. 8.

In FIG. 8 and FIG. 9, numeral 100 denotes the forward mesa ridge-embedding type semiconductor laser device, 102 denotes an n-type GaAs substrate having a (100) principal plane, 104 denotes a lower cladding layer made of n-type $Al_{0.5}Ga_{0.5}As$ disposed on the substrate 102, and 106 denotes an active layer having a multiple quantum-well (hereinafter referred to as MQW) structure disposed on the lower cladding layer 104.

The MQW structure comprises wells or well layers made of undoped $Al_{0.1}Ga_{0.9}As$, guide layers, and barrier layers (outermost layers) which are made of undoped $Al_{0.3}Ga_{0.7}As$ (hereinafter the MQW of this constitution will be referred to as an undoped $Al_{0.3}Ga_{0.7}As/Al_{0.1}Ga_{0.9}As$ MQW. MQWs made of materials of other constitutions will also be referred to similarly.)

Numeral 108 denotes an upper cladding layer made of p-type $Al_{0.5}Ga_{0.5}As$, 108a denotes a forward mesa ridge of the upper cladding layer 108, 108b denotes a parallel portion of the upper cladding layer 108, 110 denotes a cap layer made of p-type GaAs disposed on the forward mesa ridge 108a, while the forward mesa ridge 108a and the cap layer 110 constitute the forward mesa ridge portion 109.

Numeral 112 denotes a current blocking layer made of n-type GaAs disposed on the parallel portion 108b of the upper cladding layer 108, embedding the cap layer 110 and the forward mesa ridge 180a. Numeral 114 denotes a contact layer made of p-type GaAs disposed on the cap layer 110 and on the current blocking layer 112 in contact therewith. Numeral 116 denotes a p-electrode and 118 denotes an n-electrode.

Numeral 120 denotes a beam emimtting end face, 122 denotes a back end face of the semiconductor laser 100, and arrow 124 represents a laser beam.

FIG. 9 is a cross sectional view of the forward mesa ridge-embedding type semiconductor laser without the p-electrode 116 and the n-electrode 118.

The semiconductor laser 100 of such a configuration as described above operates as follows.

When a forward bias voltage is applied between the p-electrode 116 and the n-electrode 118, holes and electrons are supplied from the p-electrode 116 and from the n-electrode 118 respectively, to the active layer 106 through a path which is limited by the current blocking layer 112. The carriers (electrons and holes) are confined in the active layer 106 by the lower cladding layer 104 and the upper cladding layer 108, so that spontaneous emission of light occurs through recombination of electrons and holes in the active layer 106. The spontaneously emitted light is confined in the forward mesa ridge portion 108a that serves as a waveguide between the lower cladding layer 104 and the upper cladding layer 108, being reflected by the beam emitting end face 120 and the back end face 122, thereby inducing stimulated emission and providing an output of the laser beam 124.

In the semiconductor laser 100, the active layer is an undoped $Al_{0.3}Ga_{0.7}As/Al_{0.1}Ga_{0.9}As$ MQW structure while the lower cladding layer 104 and the upper cladding layer 108 have compositions of $Al_{0.5}Ga_{0.5}As$, and therefore the lower cladding layer 104 and the upper cladding layer 108 have a larger bandgap and a lower refractive index than the active layer 106. The current blocking layer 112 is made of GaAs, and therefore has a smaller bandgap and higher refractive index than the upper cladding layer 108.

Consequently, the light generated in the active layer 106 beneath the forward mesa ridge portion 108a of the upper cladding layer 108 is confined in a region defined between the forward mesa ridge portion 108a of the upper cladding layer 108 and the lower cladding layer 104 in the vertical direction.

Transverse light is confined by forming the parallel portion 108b of the upper cladding layer 108 with a predetermined thickness so that the active layer 106 is adjacent to the current blocking layer 112, and by having a certain part of light absorbed by the current blocking layer 112, making use of the difference in the bandgap between the active layer 106 and the current blocking layer 112 via the parallel portion 108b. This type of semiconductor laser device is called a gain waveguide semiconductor laser device.

Now a process for manufacturing the semiconductor laser device of the prior art will be described below.

The lower cladding layer 104 of n-type $Al_{0.5}Ga_{0.5}As$, the active layer 106 of an undoped $Al_{0.3}Ga_{0.7}As/Al_{0.1}Ga_{0.9}As$ MQW structure, the upper cladding layer 108 of p-type $Al_{0.5}Ga_{0.5}As$, and the cap layer 110 of p-type GaAs are formed successively on the n-type GaAs substrate 102 by an epitaxial growth process such as MOCVD.

Then an SiON film is grown on the cap layer 110 by CVD or the like to form a striped mask pattern through photolithography and etching steps, and top portions of the cap layer 110 and of the upper cladding layer 108 are removed by wet etching with the mask pattern used as a mask, thereby to form the forward mesa ridge portion 109 comprising the forward mesa ridge 108a and the cap layer 110.

Side faces of the forward mesa ridge 108a are defined by etching in a (111) A plane. Formed on the side faces of the forward mesa ridge portion 109 are current blocking layers 112 of n-type GaAs grown in the epitaxial growth process.

The mask pattern of SiON film is removed by wet etching or the like, and the contact layer 114 of p-type GaAs is formed by the MOCVD process on the cap layer 110 and on the current blocking layer 112.

Finally, the p-electrode 116 is formed on the contact layer 114 by vapor deposition or the like and, after polishing the back surface of the substrate 102 to a thickness of about 100 μm, the n-electrode 118 is formed by vapor deposition or the like, thereby completing the semiconductor laser 100.

The reason for providing the cap layer 110 on the upper cladding layer 108 of the semiconductor laser device 100 is because, without the cap layer 110, the upper cladding layer 108 would be exposed to the atmosphere and oxidized when the etching mask is removed after forming the forward mesa ridge 108a, because the upper cladding layer 108 is made of $Al_{0.5}Ga_{0.5}As$.

When an oxide film of Al is formed, electrical resistance of the device increases since this portion lies in the current path, and deterioration occurs in the crystal after regrowth. In order to prevent such a problem, the cap layer 110 of p-type GaAs is formed in the first epitaxial growth thereby to prevent an oxide film from being formed on top of the forward mesa ridge 108a when removing the etching mask after forming the forward mesa ridge 108a.

However, since the bandgap of GaAs constituting the cap layer 110 and the contact layer 114 is smaller than that of the active layer, light is absorbed in the cap layer 110. Thus absorption loss of the laser beam is decreased by making the upper cladding layer 108 with sufficient thickness.

The traditional laser device, being constructed as described above, is subjected to such a restriction that the upper cladding layer 108 must have thickness not less than a predetermined minimum, for example, 1.5 m.

Transverse light confinement is achieved by having a certain portion of light absorbed by the current blocking layer 112 by making use of the difference in the bandgap between the active layer 106 and the current blocking layer 112 which adjoin each other via the parallel portion 108b. This leads to such a problem that the transverse mode of the laser beam becomes unstable unless the width w of the base portion of the forward mesa ridge 108a is limited within a predetermined maximum.

In order to stabilize the transverse mode of the laser beam, the base width w of the forward mesa ridge 108a must be, for example, about 4 μm or less.

When the principal plane of the substrate 102 is taken in a (100) plane, however, the angle α formed between the normal direction of the parallel portion 108b of the upper cladding layer 108 and an (111)A plane which forms the side face of the forward mesa ridge 108a is 54 degrees, an angle that is defined by etching.

When the base width of the forward mesa ridge 108a is set to 4 μm, the forward mesa ridge 108a has a height limit in case both side faces of the forward mesa ridge 108a intersect, namely width u of the forward mesa ridge 108a is zero, so that the height limit is determined geometrically, that is about 1.45 μm high (the height limit will hereinafter be referred to as a "point height limit", while the thickness of the cap layer 110 is far less than the height of the forward mesa ridge 108a and is therefore negligible).

As described above, the upper cladding layer 108 must be about 1.5 μm or thicker in order to suppress the absorption loss of light in the cap layer 110, and the parallel portion 108b normally has a thickness of 0.2 to 0.3 μm. Even when this is taken into consideration, the angle formed between the normal directions of the parallel portion 108b of the upper cladding layer 108 and the side face of the forward mesa ridge 108a is predetermined, and therefore the height of the forward mesa ridge 108a becomes close to the "point height limit" with the top width u of the forward mesa ridge 108a becoming extremely narrow, resulting in increased resistance of the device.

FIG. 10 is a perspective view of a forward mesa ridge-embedding type semiconductor laser device of an another prior art. FIG. 11 is a cross sectional view taken along lines XI—XI in FIG. 10.

In FIG. 10, numeral 200 denotes the forward mesa ridge-embedding type semiconductor laser device employing an offset substrate. Numeral 202 denotes an n-type GaAs substrate having a principal plane offset by 10 degrees from a (100) plane toward a [011] orientation.

Numeral 204 denotes a lower cladding layer made of n-type $Al_{0.35}Ga_{0.15}In_{0.5}P$, 206 denotes an active layer having an undoped $Al_{0.15}Ga_{0.35}In_{0.5}P/GaInP$ MQW structure, 208 denotes an upper cladding layer made of p-type $Al_{0.35}Ga_{0.15}In_{0.5}P$, 210 denotes a cap layer made of p-type GaAs, 212 denotes a current blocking layer made of n-type GaAs, 214 denotes a contact layer made of p-type GaAs, 216 denotes a p-electrode and 218 denotes an n-electrode.

The configuration of this prior art example is different from that of the prior art example described previously in that the substrate is offset and accordingly side faces of the forward mesa ridge 208a are not symmetrical.

When the offset substrate is used, the angle β formed between the normal direction of the (111)A plane which forms one side face of the forward mesa ridge 208a and the parallel portion 208b of the upper cladding layer 208 becomes larger than 54 degrees, while the angle formed between the normal direction of the parallel portion 208b and the other side face becomes smaller.

Thus there has been such a problem that, when the ridge is made higher by making the upper cladding layer 208 thicker in order to suppress the absorption loss of light in the cap layer 210, the top width of the forward mesa ridge 208a becomes even smaller than the previous prior art example which employs the substrate 102 having a (100) plane surface, because the ridge is inclined, namely the side faces are asymmetrical, thus resulting in higher device resistance.

Also in the case of the forward mesa ridge 208a that employs the offset substrate, there has been a problem that, because the apex of the forward mesa ridge 208a is not located at the center of the forward mesa ridge 208a, non-uniform current injection into the active layer 206 as well as the narrower plateau of the forward mesa ridge 208a make it more difficult to stabilize the transverse mode.

The problems described above are not limited to the gain waveguide type semiconductor laser device, but are also encountered in a refractive index waveguide type semiconductor laser device having a current blocking layer made of a material having a bandgap larger than that of the upper cladding layer.

SUMMARY OF THE INVENTION

The present invention has been accomplished to solve the problems described above.

A first object of the present invention is to provide a forward mesa ridge-embedding type semiconductor laser device including a top portion of the forward mesa ridge interposed between the current blocking layers, which has a lower device resistance while stabilizing the transverse mode by decreasing the base width of the forward mesa ridge and decreasing the absorption loss of light by securing a sufficient thickness of the upper cladding layer.

A second object of the present invention is to provide a semiconductor laser device wherein a laser characteristics is prevented from deteriorating due to deterioration of crystal in the crystal growth interface on the forward mesa ridge.

A third object of the present invention is to provide a semiconductor laser device that reduces absorption loss of light in the cap layer on the top portion of the forward mesa ridge.

A fourth object of the present invention is to provide a semiconductor laser device having the crystal growth interface positioned outside a region wherein most of the laser light is distributed, so that crystal deterioration in the interface has less adverse effect on the laser characteristics.

A fifth object of the present invention is to provide a semiconductor laser device having an offset substrate, a wide top portion of the forward mesa ridge to reduce the device resistance and to inject current uniformly, so that the transverse mode is easily stabilized.

A sixth object of the present invention is to provide a process for manufacturing the semiconductor laser device including a top portion of the forward mesa ridge interposed between the current blocking layers, which has a lower device resistance while stabilizing the transverse mode by decreasing the base width of the forward mesa ridge and decreasing the absorption loss of light by securing a sufficient thickness of the upper cladding layer.

Although Japanese Patent No. 2842465 discloses a well-known example wherein the upper cladding layer is separated into two parts by a ridge-shaped optical guide, it employs a SAS type, i.e. inverted mesa configuration, for the ridge-shaped optical guide and is different from the present application in construction, and objects such as those of the present application are not disclosed.

Although Japanese Patent Kokai Publication No. 305486/1990 discloses a well-known example of forward mesa ridge-embedding type semiconductor laser device, it has a p-GaAs cap layer provided via a p-GaAs surface protection layer formed on top of a forward mesa ridge of a p-Al$_y$Ga$_{1-y}$As cladding layer and a shallowly etched n-GaAs current blocking layer (the current blocking layer may be removed by etching so that the p-GaAs surface protection layer and the p-GaAs cap layer make direct contact with each other), and is equivalent to the prior art described in conjunction with this application.

There is also a problem that, in a ridge-type semiconductor laser device having an insulation film on an upper cladding layer that has a forward mesa ridge, setting the width of a ridge waveguide not greater than a predetermined value and securing a thickness of the cladding layer required for effectively confining light when stabilizing the transverse mode of the semiconductor laser result in difficulty of aligning an etching mask, thus making it impossible to set the width of the ridge waveguide to a predetermined value or less. In order to solve this problem, Japanese Patent Kokai Publication No. 233556/1998 discloses an active layer that is made amorphous, except for a portion of predetermined width directly below the ridge that is left intact, so that bandgap of the active layer is greater at both sides than in the portion beneath the ridge, thereby stabilizing the transverse mode, but this laser has a construction different from that of the present application.

The semiconductor laser device according to the present invention comprises a semiconductor substrate of first conductivity type having a principal plane, a lower cladding layer of semiconductor of the first conductivity type disposed on the principal plane of the semiconductor substrate, an active layer disposed on the lower cladding layer, a first upper cladding layer made of a semiconductor of second conductivity type disposed on the active layer and having a first portion of forward mesa ridge shape extending along the principal plane of the substrate and a second portion extending on both sides of the base of the first portion with a height lower than the first portion, a current blocking layer disposed on the second portion of the first upper cladding layer and on both side faces of the first portion of the first upper cladding layer, and a second upper cladding layer made of a semiconductor of second conductivity type disposed on the first portion of the first upper cladding layer. In this semiconductor laser device, because the thickness of the upper cladding layer required for reducing the absorption loss of light is secured by means of the first portion of forward mesa ridge shape of the first upper cladding layer and the second upper cladding layer disposed on the first portion, height of the first portion of forward mesa ridge shape can be made lower and, since the plateau of the first portion of forward mesa ridge shape can be made relatively wide even when the base width of the first portion of forward mesa ridge shape made narrower in order to improve the stability of the transverse mode, thus making it possible to suppress the increase in the device resistance.

Further, a cap layer of the second conductivity type semiconductor is provided on the plateau of the first portion of the first upper cladding layer, current blocking layers are disposed on the two side faces of the cap layer, and the second upper cladding layer is disposed on the first portion of the first upper cladding layer via the cap layer, thus reducing the possibility of crystal deterioration occurring in the second upper cladding layer disposed to oppose the plateau of the first portion of the first upper cladding layer and suppressing the deterioration of the laser characteristics due to crystal deterioration.

Further, the bandgap of the cap layer is made greater than that of the active layer, with the cap layer being interposed between the first portion of the first upper cladding layer and the second upper cladding layer, and therefore it is made possible to reduce the absorption loss of light.

Further, the lower cladding layer, the active layer, the first upper cladding layer, the cap layer and the second upper cladding layer are made of an AlGaAs material that includes GaAs.

Further, the lower cladding layer, the active layer, the first upper cladding layer and the cap layer are made of an AlGaInP material and the second upper cladding layer is made of an AlGaAs material.

Further, distance from the center of the active layer to the interface of the second upper cladding layer that opposes the first portion of the first cladding layer and located on a side nearer thereto is set to or greater than such a distance from the center of the laser beam that the light intensity decreases to $1/e^2$ (e is the base of natural logarithm) of the light intensity at the beam center which is taken as unity. In other words, the composition interface of the second upper cladding layer opposing and adjacent to the first portion of the first cladding layer is out of a region having laser beam intensity greater than $1/e^2$ of a peak laser beam intensity. Thus it is possible to alleviate the adverse effect of the regrowth interface on the laser characteristics by locating the interface where crystal deterioration is likely to occur outside a region where most of the laser light energy is distributed.

Further, the principal plane of the semiconductor substrate is set to a (100) plane or to a plane equivalent thereto, the direction of extension of the first portion of the first cladding layer is set to [0–11] orientation ('–1' denotes digit 1 capped by a bar) or an orientation equivalent thereto, and the side face of the first portion is set to (111)A plane or to a plane equivalent thereto.

Further, the principal plane of the semiconductor substrate is set to a plane offset from a (100) plane by a predetermined angle toward the [011] direction or to a plane equivalent thereto, the direction of extension of the first portion of the first upper cladding layer is set to a [0–11] orientation or an orientation equivalent thereto, and the side face of the first portion is a (111)A plane or to a plane equivalent thereto, so that, when an offset substrate is provided, it is made possible to secure a wide plateau of the forward mesa ridge, prevent the device resistance from increasing, ensure uniform current injection, and stabilize the transverse mode.

Further, the active layer has a multiple quantum well structure.

The process for manufacturing the semiconductor laser device according to the present invention comprises forming the lower cladding layer of a semiconductor of the first conductivity type, the active layer, the first upper cladding layer of a semiconductor of the second conductivity type, and the cap layer of a semiconductor of the second conductivity type successively on the semiconductor substrate of the first conductivity type; forming a dielectric film on the surface of the cap layer, and forming a striped mask pattern by photolithography; etching the cap layer until the first upper cladding layer is exposed while leaving the cap layer beneath the mask by using the striped mask pattern and forming the first portion of forward mesa ridge shape extending on the first upper cladding layer and forming the second portion extending on both sides of the base of the first portion with a height lower than the first portion; forming the current blocking layer on the second portion of the first upper cladding layer, on the first portion of the first cladding layer, and on both side faces of the cap layer formed on the first portion by using the mask pattern that has been used in etching; and forming the second upper cladding layer of the semiconductor of the second conductivity type on the surface of the cap layer, after removing the mask pattern. Because the thickness of the upper cladding layer required for reducing the absorption loss of light can be secured by forming the second upper cladding layer via the cap layer on the first portion of forward mesa ridge shape of the first upper cladding layer, the height of the first portion of forward mesa ridge shape can be made smaller and, since the plateau of the first portion of forward mesa ridge shape can be made relatively wide, even when the base width of the first portion of forward mesa ridge shape is decreased by etching in order to improve the stability of the transverse mode, it is possible to prevent the crystal from deteriorating in the vicinity of the interface by forming the second upper cladding layer on the cap layer, and therefore a semiconductor laser having lower device resistance can be easily produced.

DESCRIPTION OF THE PREFERRED EMBODIMENTS Embodiment 1

Figure 1:
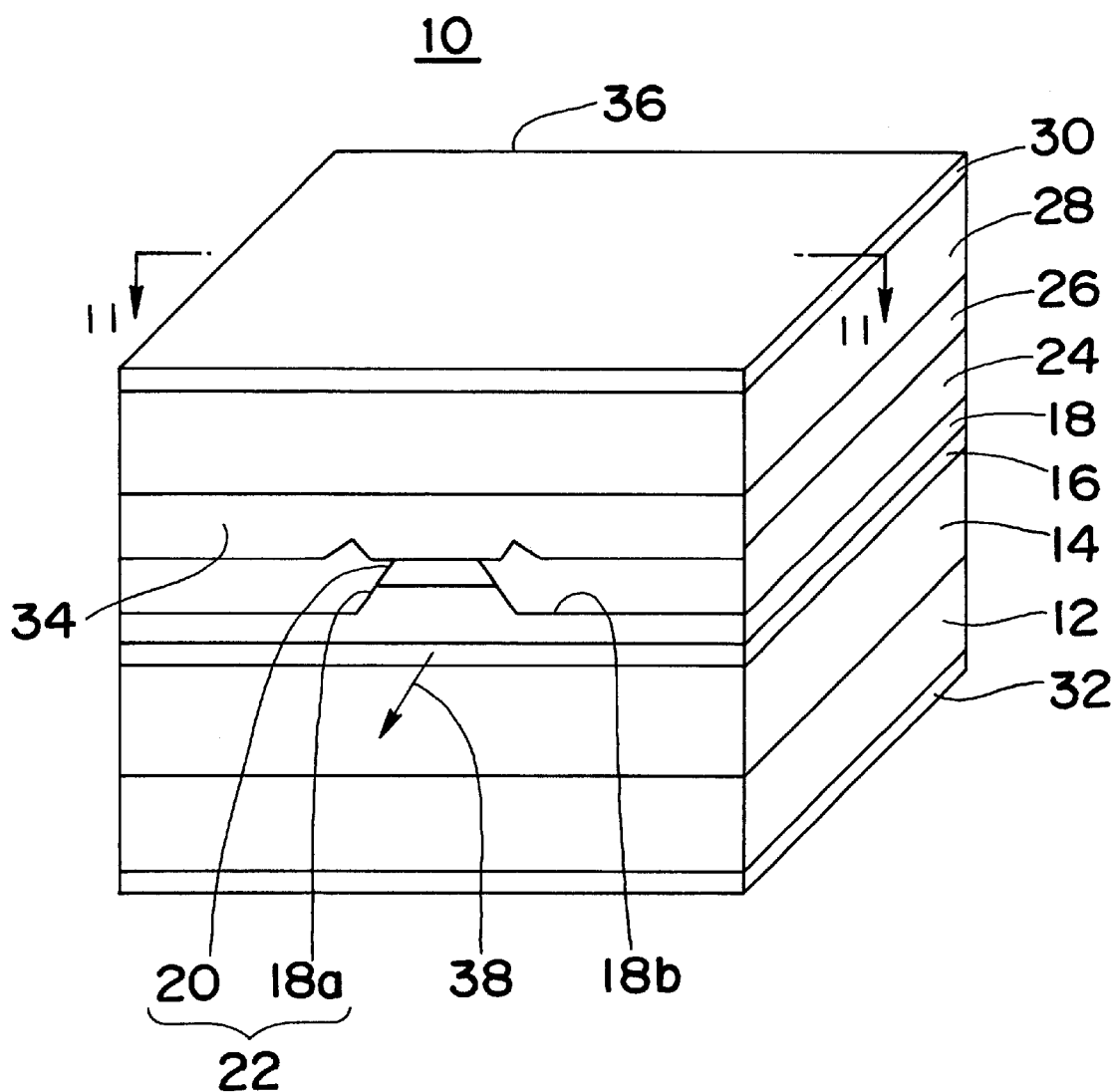
FIG. 1 is a perspective view of the semiconductor laser device according to the present invention.
Figure 2:
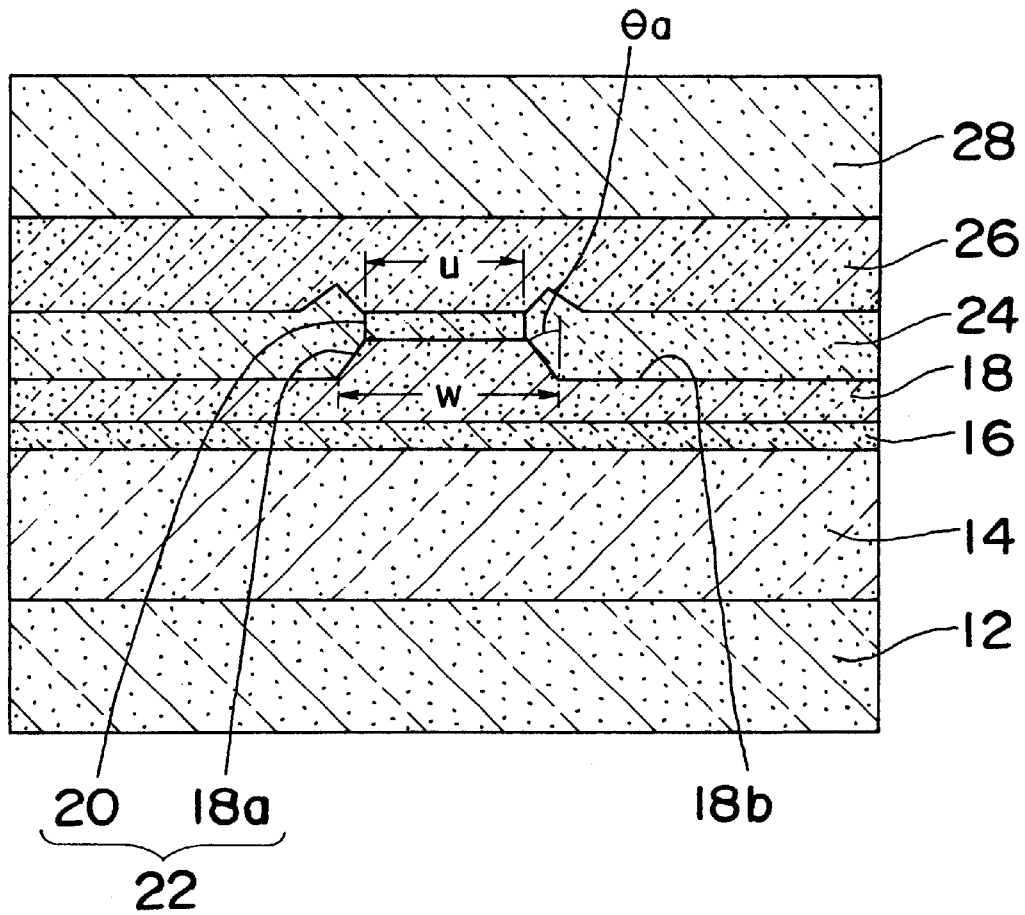
FIG. 2 is a cross sectional view taken along lines II—II in FIG. 1.

FIG. 1 is a perspective view of a forward mesa embedded ridge semiconductor laser device according to the first embodiment of the present invention, and FIG. 2 is a cross sectional view taken along lines II—II in FIG. 1.

In the description that follows, a semiconductor laser producing light having a wavelength of 780 nm (infrared) used for writing information on an MO (magneto-optical) disk and CD-R (field programmable compact) disk, which are programmable information recording media, will be taken as an example.

In FIG. 1 and FIG. 2, numeral 10 denotes a forward mesa ridge-embedded semiconductor laser device, 12 denotes an n-type GaAs substrate having a principal surface in a (100) plane, 14 denotes a lower cladding layer made of n-type $Al_{0.5}Ga_{0.5}As$ and disposed on the substrate 12 with a thickness of 1.5 µm, 16 denotes an active layer made of undoped $Al_{0.3}Ga_{0.7}As/Al_{0.1}Ga_{0.9}As$ in an MQW structure and disposed on the lower cladding layer 14 with the active layer having thickness of about 0.1 µm.

Figure 3:
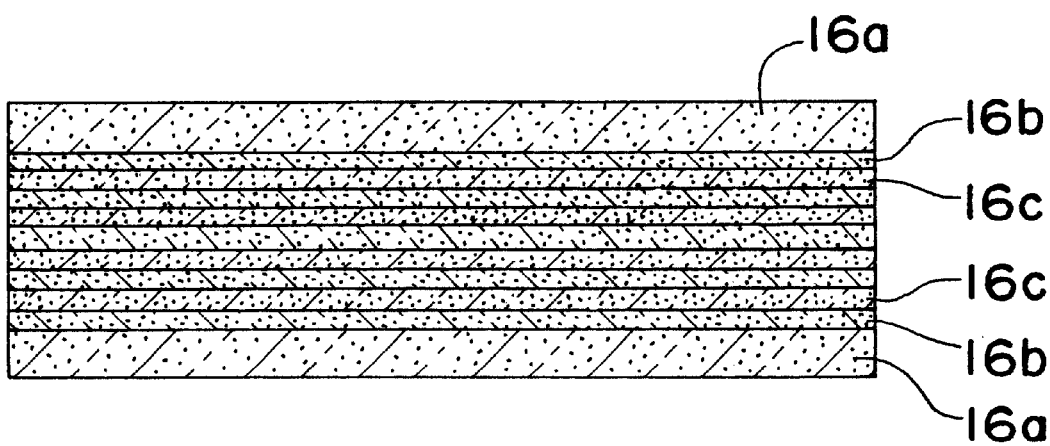
FIG. 3 is a cross sectional view of the active layer of the semiconductor laser device according to the present invention.

FIG. 3 is a cross sectional view of the active layer having an MQW structure of he semiconductor laser device according to the present invention.

In FIG. 3, numeral 16a denotes a guide layer made of undoped $Al_{0.3}Ga_{0.7}As$ having thickness of 20 nm, 16b denotes a well layer made of undoped $Al_{0.1}Ga_{0.9}As$ having thickness of 8 nm and 16c denotes a barrier layer made of undoped $Al_{0.3}Ga_{0.7}As$ having thickness of 8 nm. The compositions and thicknesses of these materials are given as mere examples. Since the bandgap of this MQW structure is substantially determined by the well layer material, the bandgap of the MQW has a value approximate to that of $Al_{0.1}Ga_{0.9}As$.

Now referring back to FIG. 1 and FIG. 2, numeral 18 denotes the first upper cladding layer made of p-type $Al_{0.5}Ga_{0.5}As$ disposed on the active layer 16 and 18a denotes a forward mesa ridge of the first upper cladding layer 18, with the forward mesa ridge 18a forming a waveguide. The longitudinal direction of the forward mesa ridge 18a extends in the [0–11] direction, the direction in which the laser beam is guided.

Numeral 18b denotes a parallel portion of the first upper cladding layer 18 extending on both sides of the base portion of the forward mesa ridge 18a and disposed parallel to the active layer 16 with a height lower than the forward mesa ridge 18a. The thickness of the first upper cladding layer 18 is 0.8 µm from the bottom surface of the first upper cladding layer 18 beneath the forward mesa ridge 18a to the plateau surface of the forward mesa ridge 18a, and the thickness of the parallel portion 18b is normally from about 0.2 μm to about 0.3 μm.

Numeral 20 denotes a cap layer made of p-type $Al_{0.2}Ga_{0.8}As$ disposed on the plateau of the forward mesa ridge 18a having a thickness of 0.01 μm. The cap layer 20 has a composition with lower proportion of Al content than that in the first upper cladding layer 18, implying that an oxide film of Al is less likely to form on the surface of the cap layer 20. Thus it is possible to reduce the possibility of crystal deterioration during regrowth of the crystal on the cap layer 20. The cap layer 20 and the forward mesa ridge 18a constitute the forward mesa ridge portion 22.

Side faces of the forward mesa ridge portion 22 are formed symmetrically with respect to the center line of the forward mesa ridge portion 22, while the side face located on the right in FIG. 2 lies in the (111)A plane and the left side face lies in (1-1-1)A plane. Consequently the angle θa which the normal direction of the parallel portion 18b forms with the (111)A plane and the (1-1-1)A plane is 54 degrees.

Numeral 24 denotes a current blocking layer made of n-type GaAs disposed on the parallel portion 18b of the first upper cladding layer 18 and on both side faces of the forward mesa ridge portion 22 so that the forward mesa ridge portion 22 is embedded, and has thickness of 0.5 μm to 0.6 μm.

Numeral 26 denotes the second upper cladding layer made of p-type $Al_{0.5}Ga_{0.5}As$ disposed on the cap layer 20 and on the current blocking layer 24 in contact therewith, and has thickness of 0.7 μm. Material for making the second upper cladding layer 26 need not necessarily have the same composition as the first upper cladding layer 18, and is required only to have bandgap greater than that of the active layer 16.

Numeral 28 denotes a contact layer made of p-type GaAs disposed on the second upper cladding layer 26 in contact therewith, 30 denotes a p-electrode disposed on the p-type GaAs contact layer, and 32 denotes a n-electrode disposed on the back side of the substrate 12.

Numeral 34 denotes a beam emitting end face of the semiconductor laser device 10, 36 denotes a backside end face and arrow 38 denotes a laser beam.

FIG. 2 is a cross sectional view showing the device wherein the p-electrode 30 and the n-electrode 32 are removed.

The process for manufacturing the semiconductor laser of the first embodiment is described below.

FIGS. 4A, 4B, 5A and 5B are cross sectional views of manufacturing steps of a semiconductor laser device according to the present invention.

First, the lower cladding layer 14 made of n-type $Al_{0.5}Ga_{0.5}As$ with a thickness of 1.5 μm, the active layer 16 made of undoped $Al_{0.3}Ga_{0.7}As/Al_{0.1}Ga_{0.9}As$ and having an MQW structure with total thickness of 0.1 μm, the first upper cladding layer 18 made of p-type $Al_{0.5}Ga_{0.5}As$ with a thickness of 0.8 μm and the cap layer 20 made of p-type $Al_{0.2}Ga_{0.8}As$ with a thickness of 0.01 μm are formed successively on the n-type GaAs substrate 12 by an epitaxial growth process, such as MOCVD. The structure made in this step is shown in cross sectional view in FIG. 4A.

Then an SiON film is formed on the cap layer 20 by a CVD process or the like, in a photolithography and etching step a striped mask pattern of the SiON film is formed to extend in the direction of guiding the laser beam, and the cap layer 20 and the top portion of the upper cladding layer 18 are partially removed in a wet etching step using the mask pattern 40 as a mask, with the etching operation being stopped to leave the parallel portion 18b of the upper cladding layer 18 with a thickness of 0.2 μm to 0.3 μm, thereby forming the forward mesa ridge portion 22 comprising the forward mesa ridge 18a and the cap layer 20.

As the etchant used in this etching step, for example, a mixture of tartaric acid and hydrogen peroxide or a mixture of sulfuric acid, hydrogen peroxide and water is employed. The structure made in this step is shown in cross sectional view in FIG. 4B.

Figure 4A:
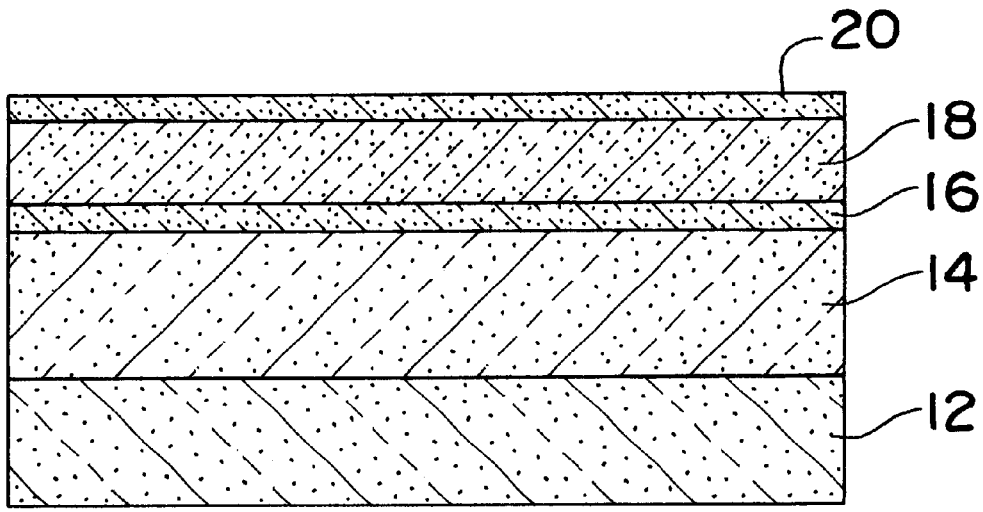
FIGS. 4A and 4B are cross sectional views of the semiconductor laser device production steps according to the present invention.
Figure 4B:
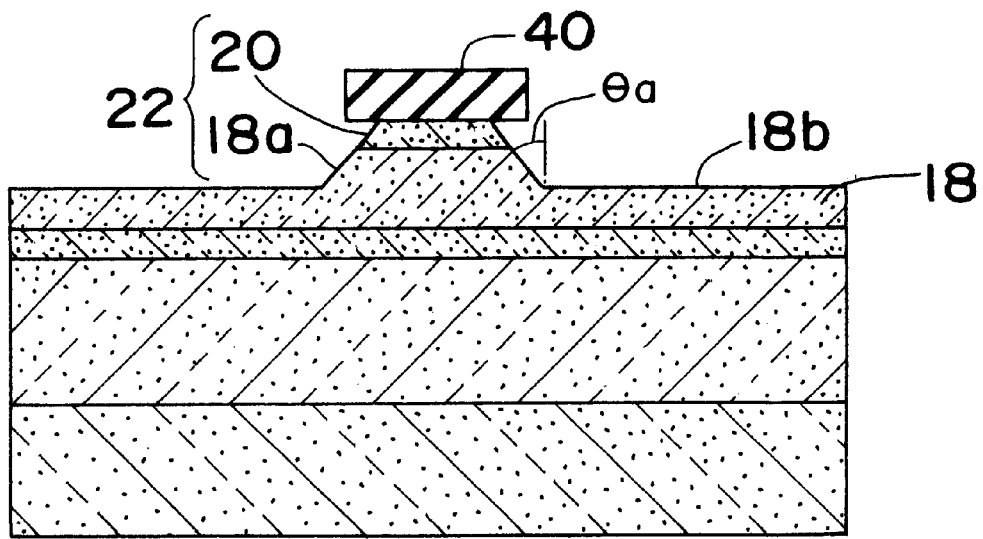
Figure 5A:
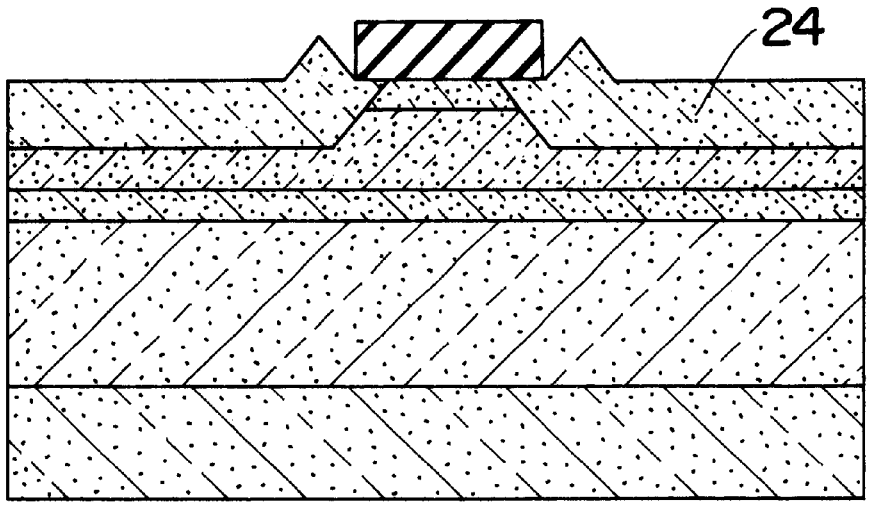
FIGS. 5A and 5B are cross sectional views of the semiconductor laser device production steps, following those of FIGS. 4A and 4B, according to the present invention.
Figure 5B:
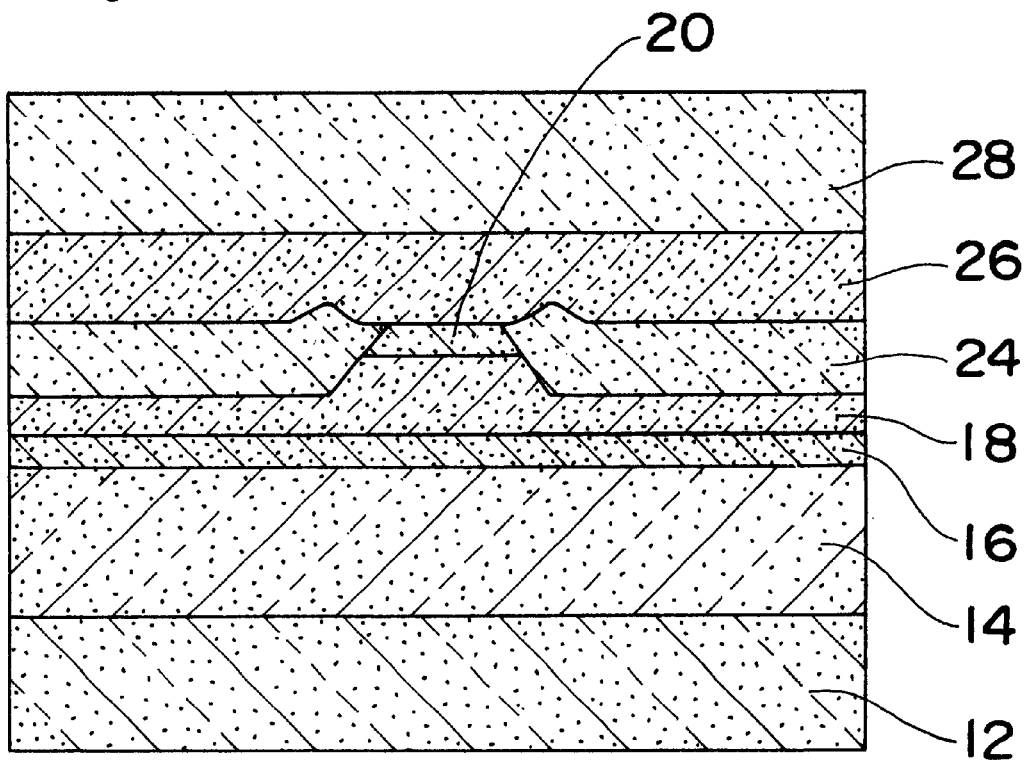

Side faces of the forward mesa ridge portion 22 are formed symmetrically with respect to the center line of the forward mesa ridge portion 22, while the side face located on the right in FIG. 4B lies in a (111)A plane and the left side face lies in a (1-1-1)A plane. Consequently the angle θa which the normal direction to the parallel portion 18b surface forms with the (111)A plane and the (1-1-1)A plane is 54 degrees.

Then the current blocking layer 24 made of n-type GaAs is formed on the side faces of the forward mesa ridge portion 22 and on the parallel portion 18b of the upper cladding layer 18 by an epitaxial growth process, such as MOCVD or the like, using the mask pattern 40 as a selective growth mask, thereby embedding the forward mesa ridge portion 22. The current blocking layer 24 has thickness of 0.5 μm to 0.6 μm. The device made in this step is shown in cross sectional view of FIG. 5A.

The mask pattern 40 of SiON film is then removed by wet etching or the like, and the second upper cladding layer 26 made of p-type $Al_{0.5}Ga_{0.5}As$ having thickness of 0.7 μm and the contact layer 28 made of p-type GaAs having a thickness of 1.0 μm are successively formed on the cap layer 20 and on the current blocking layer 24 in contact therewith by an MOCVD process or the like.

Last, the p-electrode 30 is formed on the contact layer 28 by vapor deposition or the like and, after polishing the back surface of the substrate 12 to a thickness of about 100 μm, the n-electrode 32 is formed by vapor deposition or the like, thereby completing the semiconductor laser 10.

Now the operation of the semiconductor laser according to the first embodiment is described.

When a forward bias voltage is applied between the p-electrode 30 and the n-electrode 32, holes are supplied from the p-electrode 30 through the contact layer 28 and the second upper cladding layer 26 and through a path, which is pinched by the current blocking layer 24 to become narrower, namely the forward mesa ridge portion 22 to the active layer 16, and electrons are supplied from the n-electrode 32 through the substrate 12 and the lower cladding layer 14 to the active layer 16.

The carriers (electrons and holes) are trapped in the active layer 16 by the lower cladding layer 14 and the first upper cladding layer 18, so that spontaneous emission of light occurs through recombination of electrons and holes in the active layer 16. This spontaneously emitted light is confined between the lower cladding layer 14, the first upper cladding layer 18 and the second upper cladding layer 26, while confinement in the horizontal direction is effected in a region around the active layer 16 located beneath the forward mesa ridge portion 22 as the light is absorbed by the current blocking layer 24 via the parallel portion 18b of the first upper cladding layer 18, with the emitted light being reflected on beam emitting end face 34 and the back end face 36 with the forward mesa ridge portion 22 serving as a waveguide, thereby inducing stimulated emission and providing an output of a laser beam 38.

Confinement of light in the semiconductor laser device 10 is carried out as described below.

The active layer 16 is made of undoped $A_{0.3}Ga_{0.7}As/Al_{0.1}Ga_{0.9}As$ having an MQW structure while the lower cladding layer 14, the first upper cladding layer 18 and the second upper cladding layer have compositions of $Al_{0.5}Ga_{0.5}As$, and the cap layer 20 interposed between the first upper cladding layer 18 and the second upper cladding layer is p-type $Al_{0.2}Ga_{0.8}As$, and therefore the lower cladding layer 14, the first upper cladding layer 18, the cap layer 20 and the second upper cladding layer 26 have larger bandgap energies than the active layer 16 and a lower refractive index.

The current blocking layer 24 is made of GaAs, and therefore has a bandgap energy smaller than that of the first upper cladding layer 18 and the cap layer 20 and a refractive index higher than that of the first upper cladding layer 18 and the cap layer 20.

Consequently, light generated in the active layer 16 beneath the forward mesa ridge portion 22 is confined in a region delimited by the lower cladding layer 14, the forward mesa ridge portion 22 of the first upper cladding layer 18 and the second upper cladding layer in the vertical direction, namely in the direction of stacking the layers. The confinement is effected efficiently with less absorption loss of light, since the lower cladding layer 14 has thickness of 1.5 $\mu$m, while total thickness of the first upper cladding layer 18 and the second upper cladding layer provided on the upper cladding layer side is 1.5 $\mu$m.

Horizontal confinement of light along the stacked layer surface is achieved by having a certain part of the light absorbed by the current blocking layer 24 by making use of the difference in the bandgap energies between the active layer 16 and the current blocking layer 24 via the parallel portion 18b, and therefore there is such a restraint that the characteristics of transverse mode of laser beam becomes unstable unless the base width w of the forward mesa ridge 18a interposed between the parallel portions 18b is set to a proper size, for example about 4 $\mu$m or less.

Further, in case the principal surface of the substrate 12 is a (100) plane and the side faces of the forward mesa ridge portion 22 are formed symmetrically with respect to the center line of the forward mesa ridge portion 22, while the side face located on the right-hand side in FIG. 2 lies in the (111)A plane and the left-hand side face lies in (1-1-1)A plane, there is such a restriction that the angle $\theta a$ which the normal direction to the parallel portion 18b surface of the first upper cladding layer 18 forms with the (111)A plane and the (1-1-1)A plane is 54 degrees.

When these two restraints are taken into account, the point height limit of the forward mesa ridge 18a is about 1.45 $\mu$m as noted before. When the height of the forward mesa ridge 18a of this embodiment is from 0.5 $\mu$m to 0.6 $\mu$m, for example, it is not greater than one half of the point height limit, and it is possible to make the width u of the plateau of the forward mesa ridge 18a at least one half of the base width of the forward mesa ridge 18a even when base width of the forward mesa ridge 18a is about 4 $\mu$m, thus making it possible to suppress an increase in the device resistance. Consequently power loss can be reduced and a higher output power can be obtained.

As for the range of height of the forward mesa ridge 18a, the least height can be determined by taking into consideration the thickness of the current blocking layer 24 required for current blocking and the thickness of the current blocking layer 24 required for the absorption of light in order to stabilize the transverse mode, and the upper limit can be determined from the device resistance based on the plateau width of the forward mesa ridge 18a. Based on these considerations, the range of height of the forward mesa ridge 18a becomes from about 0.4 $\mu$m to 1.1 $\mu$m.

In the embedding semiconductor laser device having the forward mesa ridge according to this embodiment as described above, the height of the forward mesa ridge can be reduced because the thickness of the upper cladding layer required for minimizing the absorption loss of light is secured by forming the upper cladding layer 20 with the first upper cladding layer 18 including a portion of the forward mesa ridge and the second upper cladding layer 26 formed by regrowth on the first upper cladding layer, and therefore the width of the plateau of the forward mesa ridge is made wider, thus making it possible to suppress an increase in the device resistance.

Also, because the first upper cladding layer 18 and the second upper cladding layer 26 work together to function as the upper cladding layer, a regrowth interface is formed between the first upper cladding layer 18 and the second upper cladding layer 26 depending on the manufacturing method. It is desired not to allow crystal deterioration to occur in the vicinity of the regrowth interface of the second upper cladding layer. In this embodiment, therefore, the cap layer 20 of p-type $Al_{0.2}Ga_{0.8}As$ is formed on the first upper cladding layer 18 in the first epitaxial growth step, and the regrowth interface is formed between the cap layer 20 and the second upper cladding layer 26.

Since the composition ratio of Al in the cap layer is 0.2, less than that of Al in the first upper cladding layer 18, which is 0.5, the possibility of the cap layer 20 being oxidized when exposed to the atmosphere is lower than that of the first upper cladding layer 18, resulting in less oxide film being formed. Thus, even when the second upper cladding layer 26 is regrown on the cap layer 20, there occurs less crystal deterioration of the second upper cladding layer 26 on the regrowth interface, thus making it possible to suppress the deterioration of the laser characteristics and improve reliability.

The cap layer 20 interposed between the first upper cladding layer 18 and the second upper cladding layer 26 is p-type $Al_{0.2}Ga_{0.8}As$ and has a bandgap that is larger than that of the active layer 16 $Al_{0.3}Ga_{0.7}As/Al_{0.1}Ga_{0.9}As$ MQW structure. As a result, even when cap layer 20 is interposed between the first upper cladding layer 18 and the second upper cladding layer 26, absorption loss of light in the cap layer 20 is very small and can be neglected, thus making it possible to make the semiconductor laser device having less light absorption and lower loss of light.

A Gaussian curve is assumed for the light intensity distribution in the cross section of laser beam that is commonly used, so that most of the laser beam is considered to be concentrated within a region having a radius from a center portion of the center laser beam intensity to portions of the decreased light intensity of $1/e^2$ (e is the base of natural logarithm) relative to the center laser beam intensity as unity.

Therefore, in consideration of the constitution of this embodiment where the regrowth interface is formed between the first upper cladding layer 18 and the second upper cladding layer 26, it is possible to mitigate the influence of crystal deterioration on the laser characteristics and suppress the deterioration of laser characteristics, even when crystal deterioration occurs in the vicinity of the regrowth interface of the second upper cladding layer 26, by locating the regrowth interface outside the region having such a radius from the center portion of the center laser beam intensity to portions of the decreased light intensity of $1/e^2$ (e is the base of natural logarithm) relative to the center laser beam intensity. In other words, the composition interface of the second upper cladding layer opposing and adjacent to the first portion of the first cladding layer is outside of a region having laser beam intensity greater than $1/e^2$ of a peak laser beam intensity.

Similarly, when forming the cap layer 20, it is made possible to suppress the deterioration of laser characteristics, even when crystal deterioration occurs in the vicinity of the regrowth interface between the cap layer 20 and the second upper cladding layer 26, by locating the surface of the cap layer 20 outside the region having such a radius from the center portion of the center laser beam intensity to portions of the decreased light intensity of $1/e^2$ (e is the base of natural logarithm) relative to the center laser beam intensity. In other words, the composition interface of the second upper cladding layer opposing and adjacent to the first portion of the first cladding layer is outside of a region having laser beam intensity larger than $1e/^2$ of a peak laser beam intensity.

While the lower cladding layer 14, the first upper cladding layer 18 and the second upper cladding layer 26 are made of $A_{0.5}Ga_{0.5}As$ in the first embodiment described above, it may also be made of $(Al_xGa_{1-x})_{0.5}In_{0.5}P$ ($1 \geq x \geq 0$). In this case, the current blocking layer 24 may be made of $(Al_yGa_{1-y})_{0.5}In_{0.5}P$ (y>x).

While the first embodiment is a semiconductor laser device that emits light at a wavelength of 780 nm (infrared) with the active layer 16 made of undoped $Al_{0.3}Ga_{0.7}As/Al_{0.1}Ga_{0.9}As$ having an MQW structure, the present invention gives similar effects also to a semiconductor laser device oscillating at a wavelength of 980 nm (infrared) if the active layer 16 is an undoped $GaAs/In_{0.1}Ga_{0.9}As$ MQW structure.

In case the semiconductor laser device oscillating at wavelength of 980 nm (infrared) is made with an active layer 16 of undoped $GaAs/In_{0.1}Ga_{0.9}As$ having an MQW structure, the current blocking layer 24 may be made of $Al_{0.7}Ga_{0.3}As$. Also the lower cladding layer 14, the first upper cladding layer 18, and the second upper cladding layer 26 may also be made of $(Al_xGa_{1-x})_{0.5}In_{0.5}P$ ($1 \geq x \geq 0$) and the current blocking layer 24 may be made of $(Al_yGa_{1-y})_{0.5}In_{0.5}P$ (y>x).

The present invention gives similar effects also to a semiconductor laser device oscillating at a wavelength of 680 nm (red) with the active layer 16 an undoped $Al_{0.15}Ga_{0.35}In_{0.5}P/GaInP$ having an MQW structure, while the lower cladding layer 14, the first upper cladding layer 18, and the second upper cladding layer 26 are made of $Al_xGa_{1-x})_{0.5}In_{0.5}P$ ($1 \geq x \geq 0$), the cap layer 20 is made of $Al_{0.1}Ga_{0.4}In_{0.5}P$ and the current blocking layer 24 is made of GaAs. In this case, the current blocking layer 24 ay be made of $(Al_yGa_{1-y})_{0.5}In_{0.5}P$ (y>x).

Embodiment 2

Figure 6:
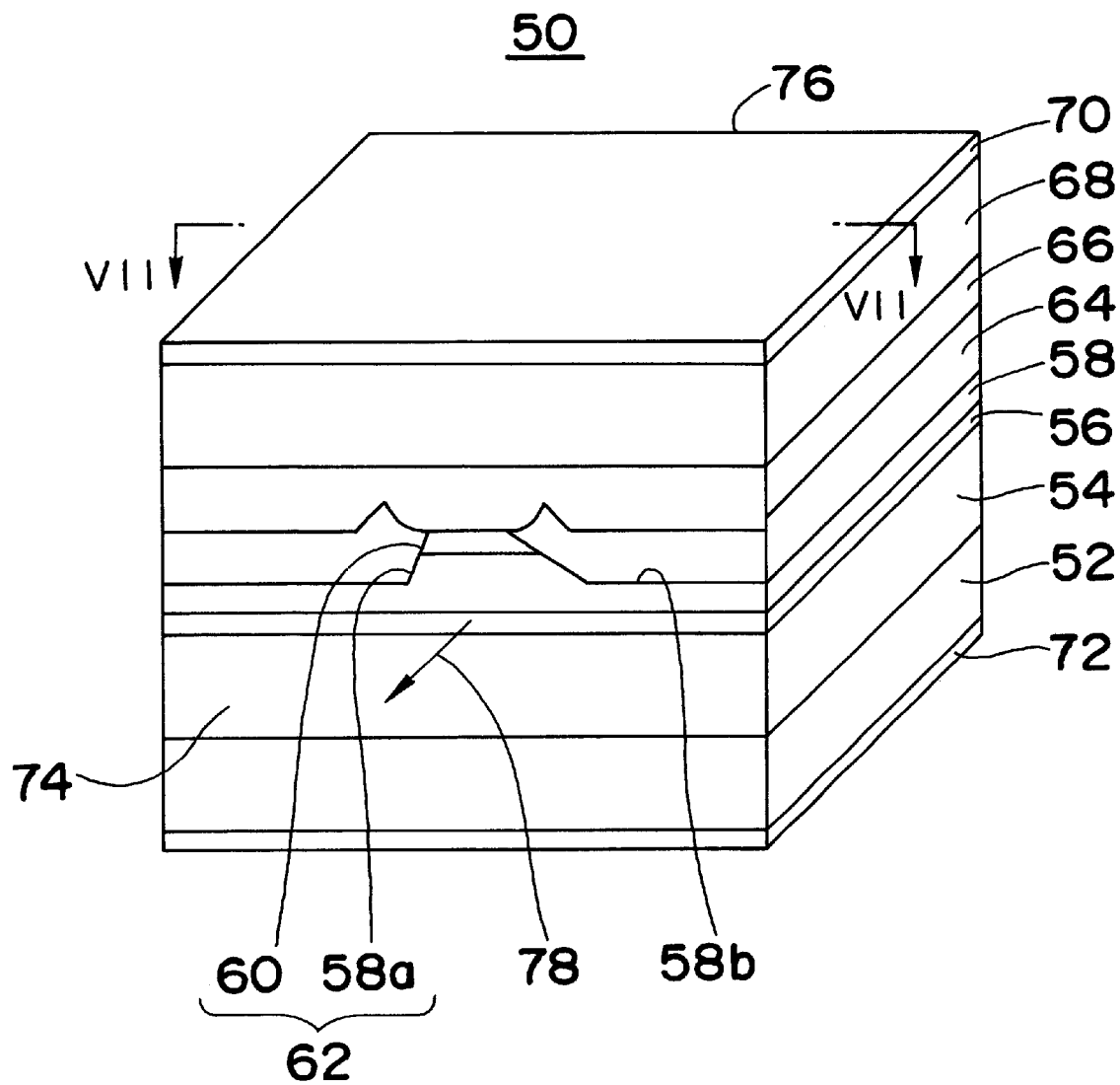
FIG. 6 is a perspective view of the semiconductor laser device according to an another embodiment of the present invention.
Figure 7:
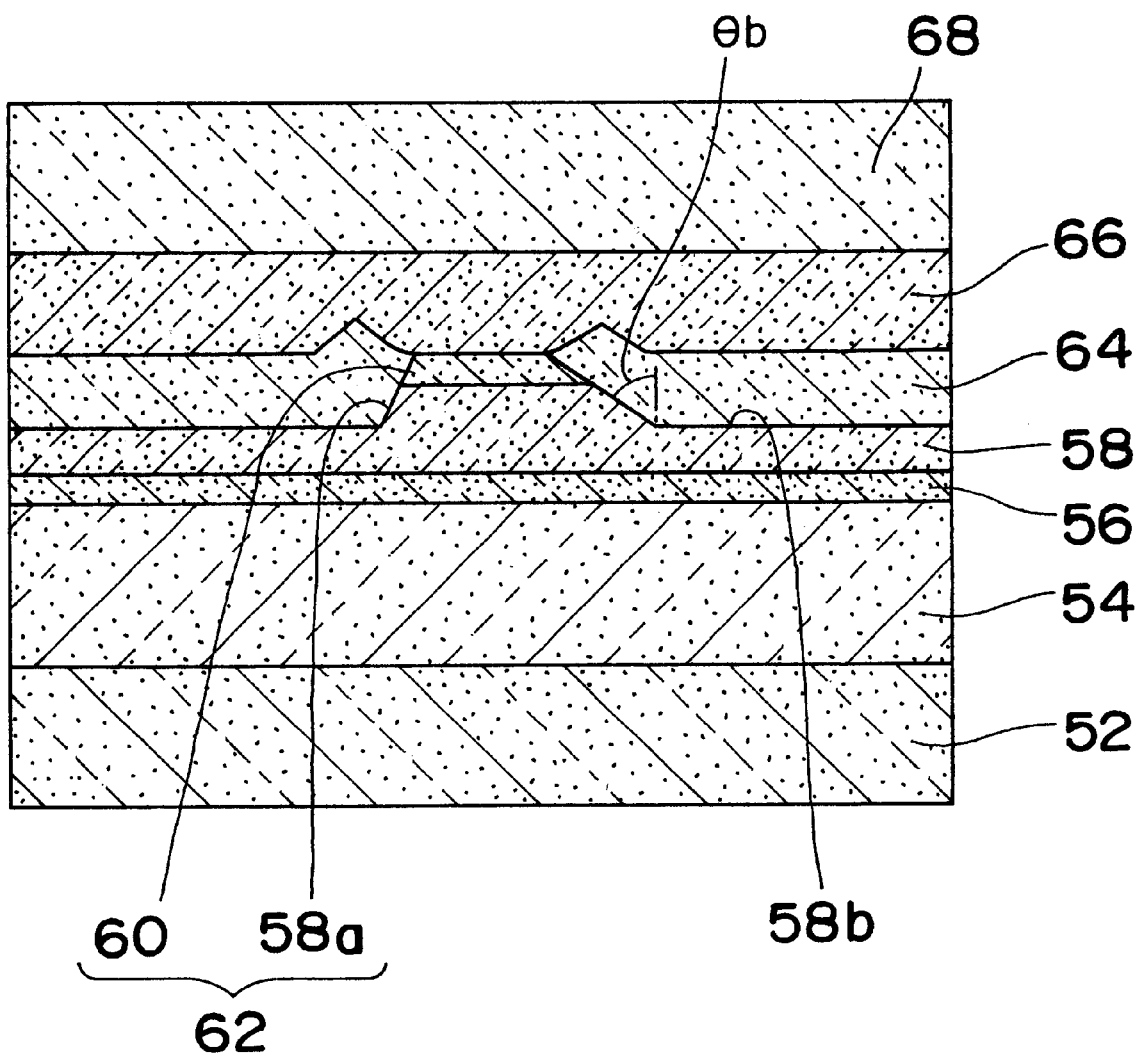
FIG. 7 is a cross sectional view taken along lines VII—VII in FIG. 6.
Figure 8:
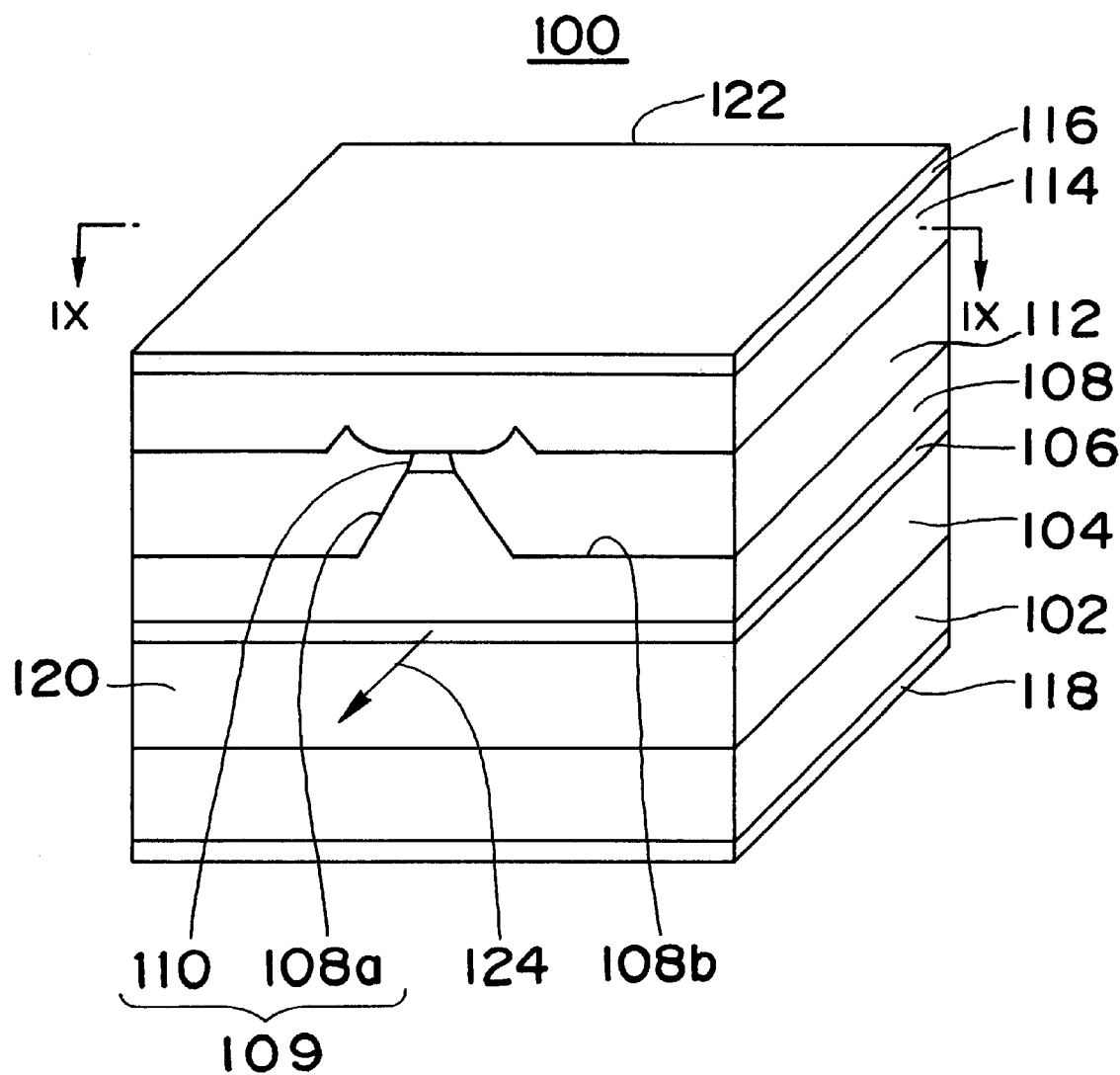
FIG. 8 is a perspective view of the semiconductor laser device of the prior art.
Figure 9:
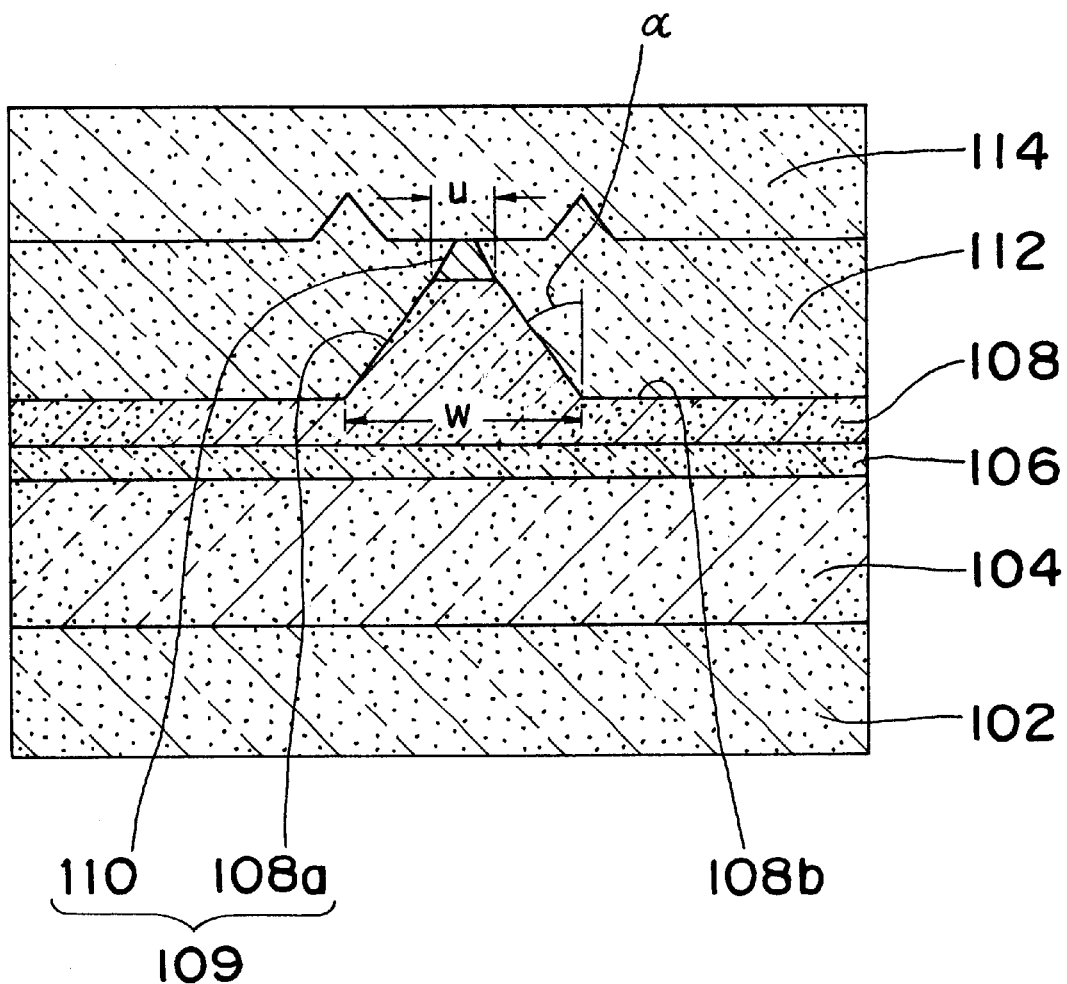
FIG. 9 is a cross sectional view taken along lines IX—IX in FIG. 8.
Figure 10:
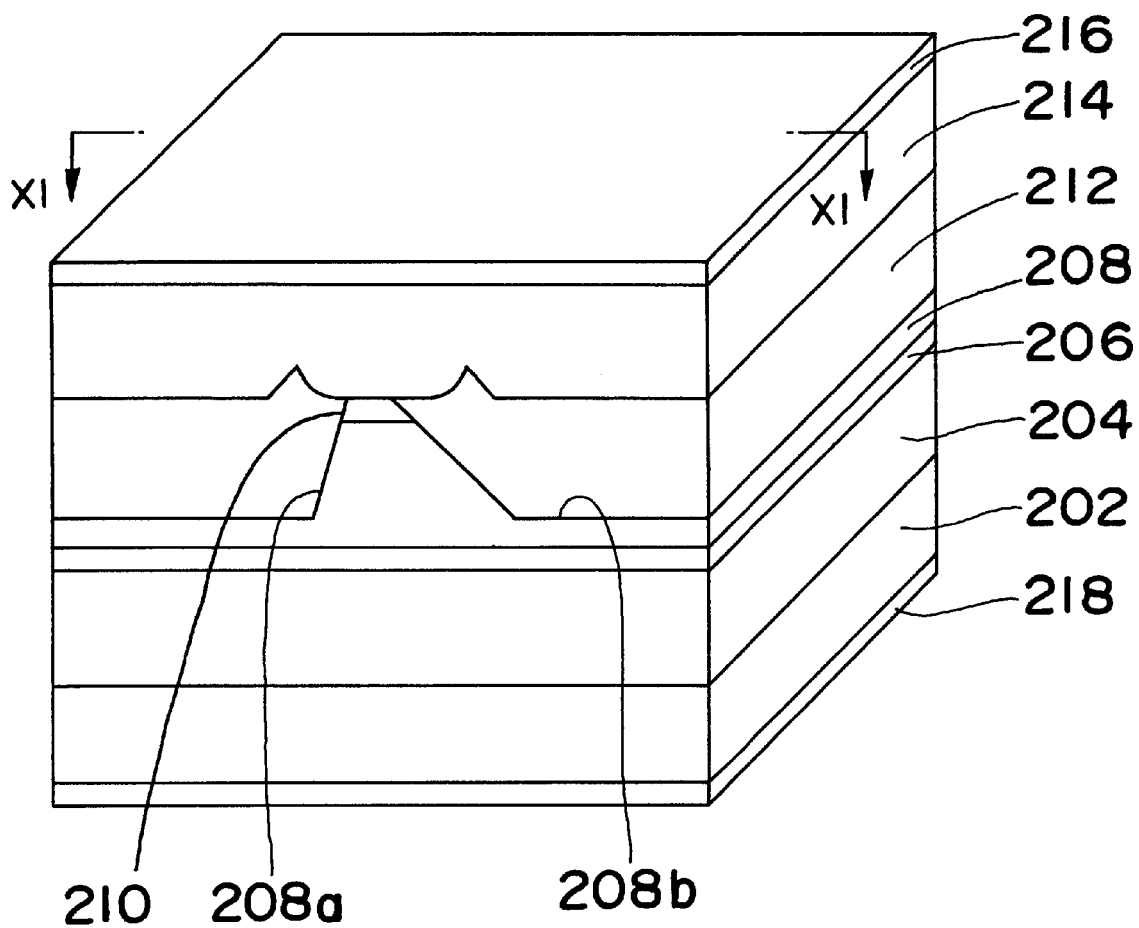
FIG. 10 is a perspective view of the semiconductor laser device of an another prior art.
Figure 11:
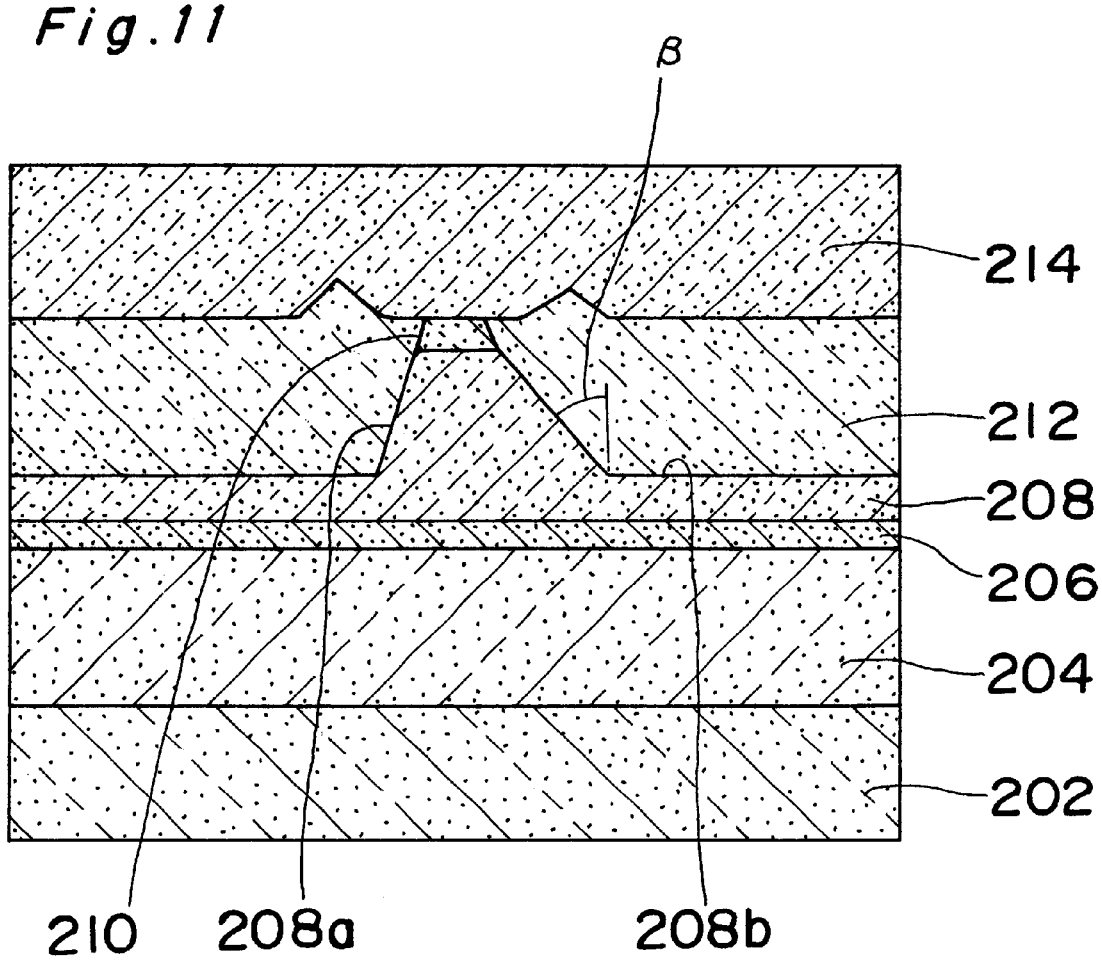
FIG. 11 is a cross sectional view taken along lines XI—XI in FIG. 10.

FIG. 6 is a perspective view of a forward mesa ridge-embedded semiconductor laser according to another embodiment of the present invention, and FIG. 7 is a cross sectional view taken along lines VII—VII in FIG. 7.

In the following description of this embodiment, a laser device that emits red beam will be taken as an example.

The major difference of the second embodiment from the first embodiment is that a semiconductor substrate having a principal surface being offset, for instance, by 10 degrees, from a (100) plane toward a [011] orientation (hereinafter referred to as the offset substrate) is used.

The offset substrate makes the plateau width u of the forward mesa ridge narrower than in the case of using a substrate without offset. The width u of the plateau of the first portion of forward mesa ridge can be made sufficiently wide by reducing the height of the forward mesa ridge formed in the first upper cladding layer thereby suppressing an increase in the device resistance. By forming the upper cladding layer from the first upper cladding layer having the forward mesa ridge and forming the second upper cladding layer through regrowth thereon, the thickness of the upper cladding layer required for reducing the absorption loss of light is secured.

In FIG. 6 and FIG. 7, numeral 50 denotes a forward mesa ridge-embedded semiconductor laser, 52 denotes an n-type GaAs substrate having a principal surface in a plane offset by a predetermined angle, for example 10 degrees in this case, from a (100) plane toward the [011] direction, 54 denotes a lower cladding layer made of $Al_{0.35}Ga_{0.15}In_{0.5}P$ and disposed on the substrate 52 with a thickness of 1.5 µm, 56 denotes an active layer made of undoped $Al_{0.15}Ga_{0.35}In_{0.5}P/GaInP$ having an MQW structure and disposed on the lower cladding layer 54 with the active layer having a thickness of about 0.1 µm.

Numeral 58 denotes a first upper cladding layer made of p-type $Al_{0.35}Ga_{0.15}In_{0.5}P$ disposed on the active layer 56 and 58a denotes a forward mesa ridge of the first upper cladding layer 58, with the forward mesa ridge 58a forming a waveguide. The longitudinal direction of the forward mesa ridge 58a extends in the [0–11] direction in which the laser beam is guided. Numeral 58b denotes a parallel portion of the first upper cladding layer 58 extending on both sides of the base portion of the forward mesa ridge 58a and disposed in parallel on the active layer 56 with a height lower than the forward mesa ridge 58a.

The thickness of the first upper cladding layer 58 is 0.8 µm from the bottom surface of the first upper cladding layer 58 beneath the forward mesa ridge 58a to the top surface of the forward mesa ridge 58a, and thickness of the parallel portion 58b is typically from about 0.2 µm to 0.3 µm. Numeral 60 denotes a cap layer made of p-type $Al_{0.1}Ga_{0.4}In_{0.5}P$ disposed on the plateau surface of the forward mesa ridge 58a and has a thickness of 0.01 µm.

The cap layer 60 is provided for the purpose of making an oxide film of Al less likely to form on the surface and to reduce the possibility of crystal deterioration occurring when regrowing thereon, and has a composition with a lower proportion of Al content than that in the first upper cladding layer 58. The cap layer 60 and the forward mesa ridge 58a constitute the forward mesa ridge portion 62.

Side faces of the forward mesa ridge portion 62 are formed asymmetrically with respect to the center line of the forward mesa ridge portion 62, while the side face located on the right-hand side in FIG. 6 lies in the (111)A plane and the left side face lies in the (1-1-1)A plane. Consequently the angle θb which the normal direction of the parallel portion 58b forms with the (111)A plane is 64 degrees, and the angle which the normal direction of the parallel portion 58b forms with the (1-1-1)A plane located on the left in FIG. 6 is 44 degrees. Thus the side face of the forward mesa ridge portion 62 is gently sloped on the right-hand side in FIG. 6 and is steep on the left-hand side.

The ratio of the plateau width u to the base width of the forward mesa ridge 58a interposed between the parallel portions 58b is even smaller than in the case of symmetrical side faces (the case of the first embodiment) and the plateau is offset to the left from the center line of the base portion of the forward mesa ridge 58*a*.

Numeral 64 denotes a current blocking layer made of n-type GaAs disposed on the parallel portion 58*b* of the first upper cladding layer 58 and on both side faces of the forward mesa ridge portion 62 so that the forward mesa ridge portion 62 is embedded below it, and has a thickness of 0.5 µm to 0.6 µm.

Numeral 66 denotes the second upper cladding layer made of p-type $Al_{0.7}Ga_{0.3}As$ disposed on the cap layer 60 and on the current blocking layer 64 in contact therewith, and has a thickness of 0.7 µm. The material for making the first upper cladding layer is p-type $Al_{0.35}Ga_{0.15}In_{0.5}P$ and that for the second upper cladding layer 66 is p-type $Al_{0.7}Ga_{0.3}As$ for the purpose of making lattice mismatch less likely to occur when forming the second upper cladding layer 66 by regrowth, and the materials of the first upper cladding layer 58 and the second upper cladding layer 66 are required only to have a bandgap energy greater than that of the active layer 56.

Numeral 68 denotes a contact layer made of p-type GaAs disposed on the second upper cladding layer 66 in contact therewith, 70 denotes a p-electrode disposed on the p-type GaAs contact layer, and 72 denotes a n-electrode disposed on the back side of the substrate 52.

Numeral 74 denotes a beam emitting end face of the semiconductor laser 50, 76 denotes a backside end face, and arrow 78 denotes laser beam.

FIG. 7 is a cross sectional view of the semiconductor laser with the p-electrode 70 and the n-electrode 72 removed.

Although the amount of offset is set to 10 degrees in the example described above, the amount of offset may be in a range from 5 to 20 degrees, or more preferably in a range from 10 to 15 degrees.

The range of height of the forward mesa ridge 58*a* is from about 0.4 µm to 1.1 µm, that is, substantially the same as that of the first embodiment.

The semiconductor laser device according to the second embodiment is manufactured in the same process as that of the first embodiment, except that the offset substrate is used.

First, the lower cladding layer 54 made of n-type $Al_{0.35}Ga_{0.15}In_{0.5}P$ with a thickness of 1.5 µm, the active layer 56 made of an undoped $Al_{0.5}Ga_{0.35}In_{0.5}P$/GaInP MQW structure with a total thickness of 0.1 µm, the first upper cladding layer 58 made of p-type $Al_{0.35}Ga_{0.15}In_{0.5}P$ with thickness of 0.8 µm, and the cap layer 60 made of p-type $Al_{0.1}Ga_{0.4}In_{0.5}P$ with thickness of 0.01 µm are formed successively on the n-type GaAs substrate 52 having a principal plane offset by 10 degrees from the (100) plane toward the [011] direction, by an epitaxial growth process such as MOCVD. The offset substrate is used for the ease of growing the crystal.

Then, an SiON film is formed on the cap layer 60 by CVD or the like, a striped mask pattern of the SiON film is formed extending in the direction of guiding the laser beam in photolithography and etching steps, top portions of the cap layer 60 and the upper cladding layer 58 are removed in a wet etching step using the mask pattern as the mask, with the etching step being stopped to leave the parallel portion 58*b* of the first upper cladding layer 58 having thickness of 0.2 µm to 0.3 µm, thereby forming the forward mesa ridge portion 62 comprising the forward mesa ridge 58*a* and the cap layer 60. As the etchant used in this etching step, for example, a mixture of sulfuric acid, hydrogen peroxide, and water is employed.

Side faces of the forward mesa ridge portion 62 are formed asymmetrically with respect to the center line of the forward mesa ridge portion 62, while the side face located on the right in FIG. 7 lies in a (111)A plane that forms angle θ*b* of 64 degrees with the normal direction of the parallel portion 58*b*, and the left side face lies in a (1-1-1)A plane that forms an angle of 44 degrees with the normal direction of the parallel portion 58*b*. Thus the side face of the forward mesa ridge 62 is gently sloped on the (111)A plane side, and is steep on the (1-1-1)A plane side.

Further, the ratio of the plateau width to the base width of the forward mesa ridge 58*a* interposed between the parallel portions 58*b* is even smaller than in the case of symmetrical side faces (in the first embodiment) and the plateau is offset to the left from the center line of the base portion of the forward mesa ridge 58*a*.

Then, the current blocking layer 64 made of n-type GaAs is formed on the side faces of the forward mesa ridge portion 62 and on the parallel portions 58*b* of the first upper cladding layer 58 by an epitaxial growth process such as MOCVD or the like, using the remaining mask pattern as a selective growth mask, thereby embedding the forward mesa ridge portion 62. The current blocking layer 64 has thickness of 0.5 µm to 0.6 µm.

The mask pattern of SiON film is then removed by wet etching or the like, and the second upper cladding layer 66 made of p-type $Al_{0.7}Ga_{0.3}As$ having a thickness of 0.7 µm and the contact layer 68 made of p-type GaAs having a thickness of 1.0 µm are successively formed on the cap layer 60 and on the current blocking layer 64 in contact therewith by MOCVD or the like.

Last, the p-electrode 70 is formed on the contact layer 68 by vapor deposition or the like and, after polishing the substrate 12 at the back surface to a thickness of about 100 µm, the n-electrode 72 is formed by vapor deposition or the like, thereby completing the semiconductor laser 50.

The second upper cladding layer 66 is made of p-type $Al_{0.7}Ga_{0.3}As$ because lattice mismatch is less likely to occur in this material. That is, in case the second upper cladding layer 66 is made of p-type $Al_{0.35}Ga_{0.15}In_{0.5}P$, similarly to the first upper cladding layer 58, crystal deterioration occurs due to strain caused by the modification of composition in the second upper cladding layer 66 of p-type $Al_{0.35}Ga_{0.15}In_{0.5}P$ in the portion which makes contact with the protrusion of the current blocking layer 64 formed at the top edges of both side faces of the forward mesa ridge 62, thus deteriorating the laser characteristics, such as reliability.

Accordingly, p-type $Al_{0.7}Ga_{0.3}As$ is used to form the second upper cladding layer 66 for minimizing the crystal strain due to modified composition, thus making it possible to obtain the semiconductor laser device emitting a red beam with good laser characteristics.

The laser mechanism and light confinement of the second embodiment of the semiconductor laser device, that is, a gain waveguide type semiconductor laser, are similar to those of the first embodiment.

In this embodiment, as the offset substrate is used, the side face of the forward mesa ridge portion 62 is gently sloped on the right-hand side in FIG. 6 and is steep on the left-hand side, while the ratio of the plateau width u to the base width of the forward mesa ridge 58*a* interposed between the parallel portions 58*b* is even smaller than in the case of symmetrical side faces (in the first embodiment).

Thus the upper cladding layer is formed from the first upper cladding layer 58 having the portion of the forward mesa ridge 58*a* and the second upper cladding layer 66 is formed by regrowth thereon, so that the thickness of the upper cladding layer required for reducing the absorption loss of light is secured, and therefore height of the forward mesa ridge 58*a* can be made lower.

This configuration solves the problem that use of the offset substrate leads to a higher forward mesa ridge 58a with a result of a further narrower plateau of the forward mesa ridge 58a than in the case of using a substrate without offset, thereby making it possible to maintain a wider plateau of the forward mesa ridge and to suppress an increase in the device resistance.

Further, since the offset substrate is used, the center of the plateau of the forward mesa ridge 58a of the first upper cladding layer 58 is offset from the center line of the base of the forward mesa ridge 58a. As a result, a problem that current injection into the active layer beneath the base of the first upper cladding layer becomes non-uniform due to the width of the plateau becoming narrower, as the forward mesa ridge 58a becomes higher and the current path is offset from the center line of the base portion of the first upper cladding layer 58, can be solved. The plateau of the forward mesa ridge can be kept wider by reducing the height of the forward mesa ridge 58a. Thus current is injected uniformly into the active layer beneath the base of the first upper cladding layer 58 and the transverse mode can be more easily stabilized even when the center of plateau of the forward mesa ridge 58a of the first upper cladding layer 58 is offset from the center line of the base of the forward mesa ridge 58a

In the second embodiment, similar effects can also be achieved in a refractive index waveguide type semiconductor laser device where the current blocking layer 64 is $(Al_yGa_{1-y})_{0.5}In_{0.5}P$ (y>0.7).

While the description of the first embodiment and the second embodiment deals with a gain waveguide semiconductor laser device having the current blocking layer 64 made of GaAs, similar effects can be achieved also in the refractive index waveguide semiconductor laser.

Although the principal surface of the semiconductor substrate is a (100) plane, the direction of the forward mesa ridge 18a is set to a [0–11] orientation, and the side faces of the forward mesa ridge 18a are in a (1-1-1)A plane and (1-1-1)A plane in the first embodiment, similar effects can be achieved also in case the principal surface of the semiconductor substrate is a predetermined crystal plane and the forward mesa ridge 18a extends parallel to the principal plane of the substrate. Both side faces of the forward mesa ridge 18a are stabilized planes of Group III elements. Namely, the principal plane of the semiconductor substrate is set to a plane equivalent to a (100) plane, the direction of the forward mesa ridge 18a is set to a direction equivalent [0–11] orientation, and the side faces of the forward mesa ridge 18a are set to planes equivalent to (111)A and (1-1-1)A planes.

Further, while the principal surface of the semiconductor substrate is set to a plane which is offset from the (100) plane by the predetermined angle toward the [011] orientation, the direction of the forward mesa ridge 18a is set to a[0–11] orientation. The side faces of the forward mesa ridge 18a are set to (111)A plane and (1-1-1)A plane in the second embodiment, similar effects can be achieved also in case the principal surface of the semiconductor substrate is offset from the predetermined crystal plane by the predetermined angle and the forward mesa ridge 18a extends parallel to the principal surface of the substrate, wherein both side faces of the forward mesa ridge 18a are stabilized planes of Group III group elements. Namely, the principal surface of the semiconductor substrate is set to a plane equivalent to a (100) plane, the direction of the forward mesa ridge 18a is set to a direction equivalent to a [0–11] orientation, and the side faces of the forward mesa ridge 18a are set to planes equivalent to (111)A and (1-1-1)A planes.

Effects of the invention

The semiconductor laser device and the process for manufacturing the same according to the present invention have the following effects because of the structure and manufacturing steps described above.

The semiconductor laser device according to the present invention comprises the first upper cladding layer made of semiconductor of the second conductivity type having the first portion of forward mesa ridge shape extending along the principal surface of the substrate and the second portion extending on both sides of the base of the first portion with a height lower than the first portion, the current blocking layer disposed on the second portion of the first upper cladding layer and on both side faces of the first portion of the first upper cladding layer, and the second upper cladding layer made of semiconductor of the second conductivity type disposed on the first portion of the first upper cladding layer. In this semiconductor laser device, because the thickness of the upper cladding layer required for reducing the absorption loss of light is secured by the first portion of forward mesa ridge shape of the first upper cladding layer and the second upper cladding layer provided on the first portion, height of the first portion of forward mesa ridge shape can be made smaller and, since the plateau of the first portion of forward mesa ridge shape can be relatively wider even than the base width of the first portion of forward mesa ridge shape in order to improve the stability of the transverse mode, an increase in the device resistance is suppressed. Consequently, a semiconductor laser device having high power efficiency, high output power, and a stable transverse mode can be produced.

Further, since the cap layer made of a semiconductor of the second conductivity type is disposed on the plateau of the first portion of the first upper cladding layer and the second upper cladding layer is disposed on the first portion of the first upper cladding layer via the cap layer, the possibility of crystal deterioration occurring in the second upper cladding layer is reduced and deterioration of the laser characteristics due to crystal deterioration is suppressed, thus making it possible to manufacture the high reliable semiconductor laser device.

Further, the bandgap of the cap layer is larger than that of the active layer, with the cap layer being interposed between the first portion of the first upper cladding layer and the second upper cladding layer, thus it is made possible to reduce the absorption loss of light and produce the semiconductor laser having high output power.

Further, since the lower cladding layer, the active layer, the first upper cladding layer, the cap layer, and the second upper cladding layer are made of an AlGaAs material that includes GaAs, a semiconductor laser device that emits beam of wavelength in infrared region and has high power efficiency, high output power, and stable transverse mode can be produced.

Further, since the lower cladding layer, the active layer, the first upper cladding layer and the cap layer are made of an AlGaInP material and the second upper cladding layer is made of an AlGaAs material, a semiconductor laser device that emits red light and has high power efficiency, high output power, and a stable transverse mode can be produced.

Further, since the distance from a center portion of the center laser beam intensity to portions of the decreased light intensity of $1/e^2$ (e is the base of natural logarithm) relative to the center laser beam intensity as unity, and the interface where crystal deterioration is likely to occur is located outside the region wherein most of the laser light is concentrated; in other words, composition interface of the second upper cladding layer opposing and adjacent to the first portion of the first cladding layer is outside of a region having laser beam intensity greater than $1/e^2$ of a peak laser beam intensity, alleviating the adverse effect of the regrowth interface on the laser characteristics and producing a semiconductor laser device having high reliability.

Further, since the principal surface of the semiconductor substrate is set to a (100) plane or to a plane equivalent thereto, the direction of extension of the first portion of the first upper cladding layer is set to a [0–11] orientation or a direction equivalent thereto, and one of the side faces of the first portion is set to a (111)A plane or to a plane equivalent thereto, a semiconductor laser device having high power efficiency, high output power, and a stable transverse mode can be produced.

Further, since the principal surface of the semiconductor substrate is set to a plane offset from a(100) plane by a predetermined angle toward the direction of [011] or in a plane equivalent thereto, the direction of extension of the first portion of the first upper cladding layer is set to a [0–11] orientation or a direction equivalent thereto, and one of the side faces of the first portion is set to a (111)A plane or to a plane equivalent thereto, hence when an offset substrate is provided, it is possible to secure a wide plateau of the forward mesa ridge, prevent the device resistance from increasing, ensure uniform current injection, and stabilize the transverse mode, so that a semiconductor laser device having high power efficiency, high output power, and a stable transverse mode can be manufactured with a low cost.

Further, since the active layer has a multiple quantum well structure, a semiconductor laser device having a low threshold current for oscillation, high power efficiency, high output power, and a stable transverse mode can be produced.

The process for manufacturing the semiconductor laser device according to the present invention comprises forming the lower cladding layer of a semiconductor of the first conductivity type, the active layer, the first upper cladding layer of a semiconductor of the second conductivity type, and the cap layer of a semiconductor of the second conductivity type successively on the semiconductor substrate of the first conductivity type; forming the dielectric film on the surface of the cap layer and forming the striped mask pattern by photolithography; etching the cap layer until the first upper cladding layer is exposed, while leaving the cap layer beneath the mask, by using the striped mask pattern and forming the first portion of forward mesa ridge shape on the first upper cladding layer and forming the second portion extending on both sides of the base of the first portion with a height smaller than the first portion; forming the current blocking layer on the second portion of the first upper cladding layer, on the first portion of the first upper cladding layer and on both side faces of the cap layer formed on the first portion by using the mask pattern used in etching; and forming the second upper cladding layer of a semiconductor of the second conductivity type on the surface of the cap layer after removing the mask pattern. Because the thickness of the upper cladding layer required for reducing the absorption loss of light can be secured by forming the second upper cladding layer via the cap layer on the first portion having a forward mesa ridge shape of the first upper cladding layer, the height of the first portion of forward mesa ridge shape can be made lower and, since the plateau of the first portion of forward mesa ridge shape can be made relatively wider even when the base width of the first portion of forward mesa ridge shape is decreased by etching in order to improve the stability of the transverse mode, thus it is made possible to prevent the crystal from deteriorating in the vicinity of the interface by forming the second upper cladding layer on the cap layer, and, therefore, a semiconductor laser device having lower device resistance, high power efficiency, high output power, and s stable transverse mode can be easily produced.

What is claimed is:

1. A semiconductor laser device comprising:

a semiconductor substrate having a first conductivity type and a surface in a crystallographic plane;

a lower cladding layer of the first conductivity type disposed on the surface of said semiconductor substrate;

an active layer disposed on said lower cladding layer;

a first upper cladding layer of a second conductivity type, disposed on said active layer, said first upper cladding layer including a first portion having a forward mesa ridge shape and a second portion extending along sides of a base of the first portion and thinner than the first portion;

a current blocking layer disposed on opposite sides of both the first and second portions of the first upper cladding layer; and a second upper cladding layer of the second conductivity type disposed on the first portion of said first upper cladding layer.

2. The semiconductor laser device according to claim 1, further comprising a cap layer of the second conductivity type on a plateau of the first portion of said first upper cladding layer wherein said current blocking layer is disposed on opposite sides of said cap layer, and said second upper cladding layer is disposed opposite the first portion of said first upper cladding layer on said cap layer.

3. The semiconductor laser device according to claim 2, wherein said cap layer has a bandgap energy larger than said active layer.

4. The semiconductor laser device according to claim 2, wherein said lower cladding layer, said active layer, said first upper cladding layer, said cap layers, and said second upper cladding layer are AlGaAs based materials, including GaAs.

5. The semiconductor laser device according to claim 2, wherein said lower cladding layer, said active layer, said first upper cladding layer, and said cap layer are AlGaInP based materials and said second upper cladding layer is an AlGaAs based material.

6. The semiconductor laser device according to the claim 1, wherein an interface of said second upper cladding layer opposing and adjacent to the first portion of said first cladding layer is outside of a region having laser beam intensity greater than $1/e^2$ of a peak laser beam intensity.

7. The semiconductor laser device according to the claim 1, wherein said active layer comprises a multiple quantum well structure.

8. The semiconductor laser device according to claim 1, wherein the surface of said semiconductor substrate is a (100) plane, an extending direction of the first portion of said first cladding layer has a [0–11] orientation, and the side face of the first portion is a (111)A plane.

9. The semiconductor laser device according to claim 1, wherein the surface of said semiconductor substrate is a plane offset from a (100) plane toward a [011] direction, an extending direction of the first portion of said first upper first portion of said first cladding layer has a [0–11] direction, and the side face of the first portion is a (111)A plane.

* * * * *